United States Patent [19]

Du et al.

[11] 4,392,893

[45] Jul. 12, 1983

[54] METHOD FOR CONTROLLING CHARACTERISTICS OF A SEMICONDUCTOR INTEGRATED CIRCUIT BY X-RAY BOMBARDMENT

[75] Inventors: Nguyen T. Du, Hatogaya; Akihide Asao, Ohita, both of Japan

[73] Assignee: Texas Instruments Incorporated, Dallas, Tex.

[21] Appl. No.: 207,178

[22] Filed: Nov. 17, 1980

[51] Int. Cl.³ .................. H01L 21/265; B01J 17/00
[52] U.S. Cl. .................................. 148/1.5; 29/576 B; 148/187; 357/91; 427/35; 427/43.1
[58] Field of Search .................. 324/158 T; 148/1.5, 148/187; 357/91; 427/35, 43.1; 29/576 B

[56] References Cited

U.S. PATENT DOCUMENTS

| | | | |
|---|---|---|---|
| 3,570,112 | 3/1971 | Barry et al. | 29/571 |
| 3,688,389 | 9/1972 | Nakamura et al. | 29/571 |
| 4,184,896 | 1/1980 | Miles | 145/1.5 |

OTHER PUBLICATIONS

Voland et al., Appl. Physics, 8 (1975) 211.
Dimaria et al., J. Appl. Phys. 48 (1977) 898.
Verhoeven et al., Phys., Stat. Sol. 24a (1974) p. 441.
Siiygh et al., Radiation Effects, 60 (1982) 161.

Primary Examiner—Upendra Roy
Attorney, Agent, or Firm—John G. Graham

[57] ABSTRACT

The characteristics of integrated circuits, such as the gate threshold voltage (Vtx) of insulated gate field effect transistors, or the current amplification factor ($h_{FE}$) of bipolar transistors are altered by the irradiation of the X-ray with predetermined amount.

The X-ray irradiation is used to make the integrated circuits with very accurate characteristics with high yield of production. It is also used to make variety of sample information by changing the characteristics of the same device one after another.

6 Claims, 2 Drawing Figures

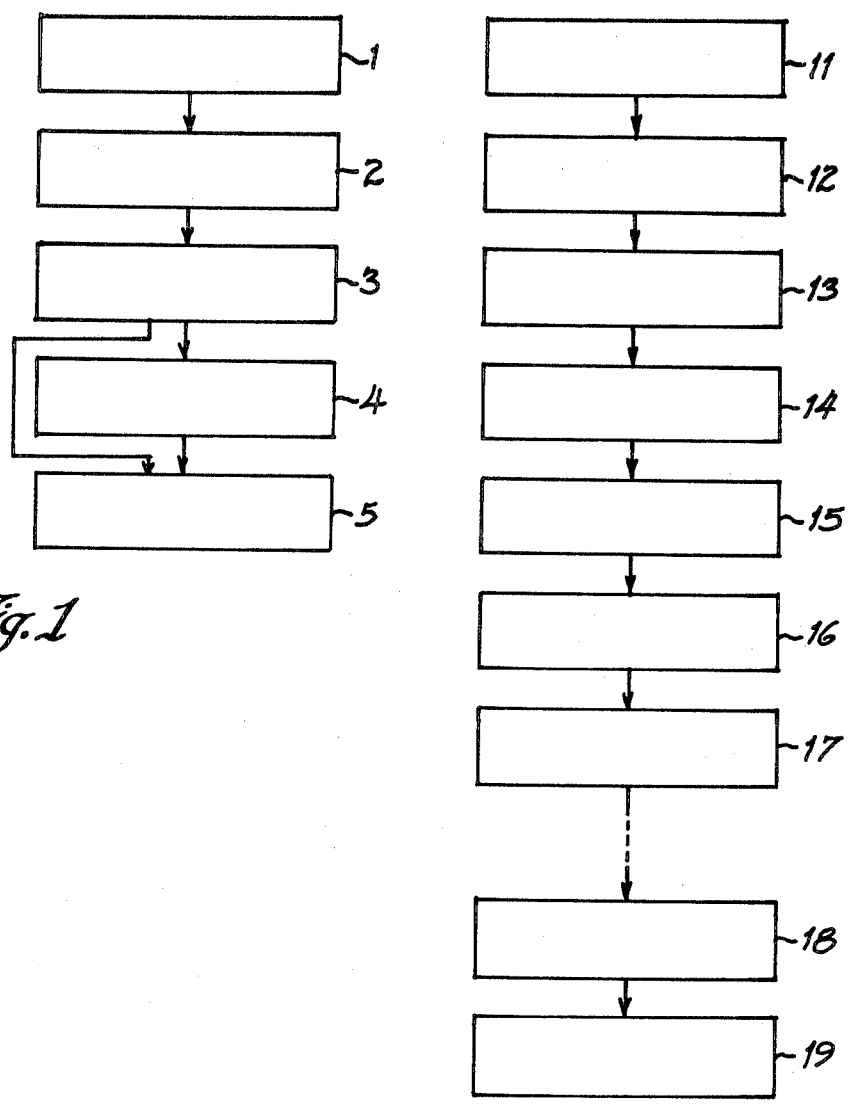

METHOD FOR CONTROLLING CHARACTERISTICS OF A SEMICONDUCTOR INTEGRATED CIRCUIT BY X-RAY BOMBARDMENT

BACKGROUND OF THE INVENTION

The present invention relates to a method for controlling characteristics of a semiconductor integrated circuit (IC), and more particularly to a method for controlling characteristics of a semiconductor device formed in the semiconductor IC by irradiating an X-ray on a surface of the semiconductor device.

A important characteristic of a semiconductor integrated circuit such as an IC having a number of insulated gate field effect transistors (IGFET's) formed therein, e.g. a gate threshold voltage (Vtx) of the IGFET is determined by a manufacturing process thereof. An impurity concentration on a surface of a silicon substrate, a property and a thickness of a gate oxide film and gate electrode material are important factors to determine Vtx and it is difficult to change Vtx after the semiconductor device has been fabricated. It is possible to control Vtx by additional diffusion or ion implantation to a gate area during the manufacturing process of the semiconductor device but this method cannot be applied after the formation of the electrode.

On the other hand, it has been attempted to adjust the characteristic of the FET by a gamma ray or X-ray but this technology has not yet been put into practice because the characteristic of the irradiated FET changes in a subsequent thermal process.

The present invention has been made in the above background and it is an object of the present invention to provide a method for controllably altering an important basic characteristic of an IC wafer, e.g. a gate threshold voltage Vtx of an IGFET after the manufacturing process thereof. It is another object of the present invention to bring the basic characteristic as close to a specified value as possible to provide an IC having a uniform characteristic. It is still another object of the present invention to adjust the basic characteristic which somewhat deviates from a permissible range of the specification by an X-ray irradiation to bring it into the permissible range in order to enhance a yield of the IC.

In addition, it is an object of a second embodiment of the present invention to shorten a cycle time for characterization in designing a new IC product in order to shorten a period from the IC circuit design to the supply of the IC to market place.

It is a further object of the present invention to provide a method for obtaining a large volume of data from a small number of test sample IC's for feeding back the information for reviewing the circuit design and the manufacturing process.

BRIEF DESCRIPTION OF THE DRAWINGS

The present invention will now be explained with reference to the accompanying drawings.

FIG. 1 is a flow chart illustrating a first embodiment of the present invention, and FIG. 2 is a flow chart illustrating a second embodiment of the present invention.

DETAILED DESCRIPTION

FIG. 1 shows a flow chart which illustrates processing steps in a first embodiment of the present invention. An IC wafer manufacturing step 1 includes a sub-step for preparing a silicon substrate to be used as an IC substrate, a sub-step for forming source and drain regions of IGFET's by diffusion process or ion implantation process, a sub-step for forming gate areas and a sub-step for forming source, drain and gate electrodes. A so-called silicon gate technology may be used. What is important in this step is a conductivity type of the IC wafer and a substrate resistivity thereof. In the present embodiment, a P-type silicon substrate having a substrate resistivity ($\rho$) of no more than 10$\Omega$.cm, e.g. a single crystal silicon having a substrate resistivity of 8$\Omega$.cm, doped with boron impurity is used.

In a protective layer forming step 2, a protective coating of silicon nitride or polyimide resin is deposited by plasma method on a semiconductor IC wafer on which semiconductor devices of the IC and interconnection therefor have been formed. This layer serves to protect the IC against humidity.

In a characteristic test step 3, characteristics of the IC including the gate threshold voltage Vtx of the IGFET are tested and Vtx values are recorded for each of the IC's of the wafer.

After the characteristic test step 3, the IC wafer which meets the required electrical characteristics, specifically that having a gate threshold voltage Vtx within a range of ±0.2 volts from a required value proceeds to a packaging step 5 without being subjected to an X-ray irradiation step 4, but the IC wafer having a gate threshold voltage Vtx beyond a range of ±0.2 volts from the required value, especially that having a higher Vtx than the above range is subjected to the X-ray irradiation in the X-ray irradiation step 4. The amount of change of the gate threshold voltage Vtx is a function of the amount of irradiation of the X-ray, that is, the irradiation intensity and the irradiation time, and a relationship thereof can be predetermined by Vtx=F (X-ray exposure) with a sufficient accuracy. Experimentarily, assuming that a voltage between an X-ray changed particle source and a target is fixed to 60 kilovolts, the Vtx changes by approximately 0.04 volts by 10-minute X-ray irridation, 0.07 volts by 20-minute X-ray irradiation and 0.1 volt by 30-minute X-ray irradiation. When the voltage is raised to 80 kilovolts, the Vtx changes by 0.13 volts by 10-minute X-ray irradiation, 0.16 volts by 20-minute X-ray irradiation and 0.19 volts by 30-minute X-ray irradiation. If the silicon substrate of the IC wafer is of P-type, the gate threshold voltage Vtx decreases from its initial value by the amount described above. It should be understood that the relationship between the X-ray exposure and the amount of change of Vtx depends on a particular silicon substrate used.

By experimentarily determining the relationship between those previously, the gate threshold Vtx recorded in the characteristic test step 3 can be changed to the permissible range in the X-ray irradiation step 4. Even if the Vtx is within the permissible range in the characeristic test step 3, it is preferable from a view point of the enhancement of the performance of IGFET to bring the Vtx to an optimum value as closely as possible. For example, when an actual initial value is 1.1 volts while a required optimum value for Vtx is 1.0 volt, it is within the permissible range but Vtx can be brought to 1.0 volt by irradiating the X-ray to the IGFET for 30-minutes under a condition of 60 kilovolts.

The IC passed through the X-ray irradiation step 4 is moved into a packaging step 5 which includes sub-step of dividing the IC wafer into chips, mounting them on a lead frame, wire bonding, resin molding and final testing. In the present embodiment, the X-ray irradiation step 4 is placed between the wafer characteristic test step 3 and the packaging step 5. Alternatively, it may be placed after the packaging step 5 if the amount of X-ray irradiation is little increased.

In the IC wafer manufacturing step 1, the P-type silicon substrate is adopted such that the substrate resistivity at least at the channel area of the IGFET is no more than $10\Omega.cm$ in order to assure that the influence by the X-ray irradiation does not disappear by various processes.

The first embodiment of the present invention finds its significant effect particularly in the manufacture of a new IC, that is, an IC of a new circuit design or an IC in which new conditions (such as formation conditions of a gate oxide film and temperature thereof) are introduced in the IC wafer manufacturing step 1. The new IC generally has a low initial yield. Through the control of Vtx in accordance with the present invention, many IC chips which would have been rejected as failure IC's in the prior art technique can be brought into the permissible range of the specification and in some case the yield can be enhanced by several tens percent. The present invention may not be very significant for the matured IC's but it provides an extremely significant economical advantage for newly developed IC's.

A second embodiment of the present invention will now be explained with reference to a flow chart shown in FIG. 2. In the manufacture of a new IC or in the introduction of a new IC wafer manufacturing process based on a new circuit design, an IC manufacturing engineer manufactures many IC's having various parameters to investigate the changes of electrical characteristics of the circuits for the various parameters. It is an essential work to determine optimum specifications for the mass production circuit design and manufacturing steps. In the prior art method of manufacturing the IC's including the IGFET's, this work (characterization) has been implemented by preparing a number of IC wafers having slightly different gate threshold Vtx and checking the characteristics thereof. In this method, in order to prepare the IC wafers having various Vtx, the impurity concentration of the channel area of the IGFET must be changed by changing the silicon wafer per se or by additional impurity diffusion or ion implantation. Accordingly, a small number of IC's having various characteristics must be prepared with a high accuracy and hence a relatively long work period or cycle time is required. In addition, for a newly designed IC, process requirements differ slightly from wafer to wafer and IC's having different basic conditions (such as depth of diffusion region and channel length) other than the required Vtx must be compared and analyzed.

The second embodiment of the present invention eliminates such difficulties and it provides a method which significantly shortens the cycle time of the characterization and presents a number of different test data by controlling only the target gate threshold Vtx.

Referring to FIG. 2, in an IC wafer manufacturing step 11, a silicon substrate to be used as an IC substrate is prepared and source and drain regions of the IGFET are formed by impurity diffusion or ion implantation. Following to the formation of a gate area, the electrodes for source, drain and gate and interconnections are formed. In this step, a so-called silicon gate method may be used. A silicon substrate suited for use in the embodiment of the present invention is a P-type silicon substrate having a substrate resistivity of no more than $10\Omega.cm$. In the present embodiment, a substrate having a substrate resistivity of $8\Omega.cm$ is used. Formed on the P-type silicon substrate is an IGFET having a relatively high gate threshold Vtx.

In a protective layer forming step 12, a protective coating of silicon nitride or polyimid resin is deposited by plasma method on the semiconductor IC on which semiconductor devices of the IC and interconnections therefor have been formed. It serves to protect the IC against humidity.

Then, a first characteristic check step 13 is carried out. In this step, various electrical characteristics of the IC corresponding to the highest Vtx are checked and recorded. In a following step 14, the first X-ray irradiation is carried out to the IC by a predetermined amount as explained above, the value of Vtx can be changed by a desired amount by properly selecting the amount of X-ray irradiation or the intensity of the irradiation and the irradiation time. For an N-channel IGFET which uses a P-type silicon subtrate, the value of Vtx can be decreased. Through 30-minute X-ray irradiation, Vtx is reduced by 0.1 volt, and in a step 15 the electrical characteristics are again checked and recorded. In this manner, Vtx is respectively changed several times by 0.1 volt or 0.2 volts at a time and the electrical characteristics of the IC for the respective Vtx which change from the initial highest value to the vicinity of zero are measured and recorded.

Based on those records, the Vtx which optimizes the electrical characteristics required for the IC is determined and the resulting information is fed back to a circuit design and IC manufacturing step (in a step 19) and finally an optimum specification for the circuit design and IC manufacturing step is determined (in a step 19).

According to the second embodiment of the present invention, various characteristics for stepwise changing gate threshold Vtx can be checked from one and the same IC chip. As a result, the step of preparing a number of test samples having different Vtx's, which are required in the prior art method, is no longer necessary and a large volume of data can be obtained from a small number of sample IC's and the cycle time can be shortened. Furthermore, according to the present invention, since the characteristics are checked for one and the same IC, the characterization can be accomplished with a high accuracy. In the prior art method where different samples having different Vtx's are used, the gate oxide films, channel lengths and silicon gate widths unavoidably change from wafer to wafer or from lot to lot, if not substantially. In this sense, the effect by the characterization of the present invention in extremely significant.

While the IC including the insulated gate FET's has been used in the embodiments described above the present invention is not limited to such IC but it is also applicable to an IC including bipolar transistors. In this case, the X-ray is irradiated to control the condition of a surface area in a base region in order to control a current amplification factor h FE of the transistor.

What is claimed is:

1. A method for manufacturing a semiconductor integrated circuit to provide a specific value of an electrical characteristic, comprising the steps of preparing a silicon substrate for said integrated circuit having a substrate resistivity of no more than $10\Omega$. cm at least at a portion of said substrate, forming a semiconductor device at an area including said portion of said substrate, testing said electrical characteristic of said integrated circuit, and thereafter irradiating a predetermined amount of X-ray to a surface of said semiconductor device of said integrated circuit to alter said electrical characteric measured in said test.

2. A method for manufacturing a semiconductor integrated circuit to provide a specific value of an electrical characteristic, comprising the steps of checking said specific electrical characteristics of a semiconductor device of said integrated circuit, and thereafter respectively irradiating an X-ray to said semiconductor device to alter said electrical characteristics of said semiconductor device.

3. A method according to claim 1 wherein said semiconductor device is an insulated gate field effect transistor, and said electrical characteristic is gate threshold voltage.

4. A method according to claim 3 wherein said step of irradiating is at a level of at least 60 kilovolts for at least ten minutes.

5. A method according to claim 2 wherein said semiconductor device is an insulated gate field effect transistor, and said electrical characteristic is gate threshold voltage.

6. A method according to claim 5 wherein said step of irradiating is at a level of at least 60 kilovolts for at least ten minutes.

* * * * *